United States Patent [19]

Liu

[11] Patent Number: 5,568,125
[45] Date of Patent: Oct. 22, 1996

[54] TWO-STAGE ANNEALING PROCESS FOR AMORPHOUS RIBBON USED IN AN EAS MARKER

[75] Inventor: Nen-Chin Liu, Parkland, Fla.

[73] Assignee: Sensormatic Electronics Corporation, Deerfield Beach, Fla.

[21] Appl. No.: 508,580

[22] Filed: Jul. 28, 1995

Related U.S. Application Data

[63] Continuation-in-part of Ser. No. 269,651, Jun. 30, 1994, Pat. No. 5,469,140, and a continuation-in-part of Ser. No. 392,070, Feb. 22, 1995, and a continuation-in-part of Ser. No. 420,757, Apr. 12, 1995.

[51] Int. Cl.$^6$ ............................................. G08B 13/24
[52] U.S. Cl. .................... 340/551; 148/108; 148/DIG. 3; 266/110; 266/249
[58] Field of Search ........................... 340/551; 148/108, 148/103, DIG. 3; 266/110, 249; 29/DIG. 95, DIG. 49, DIG. 25

[56] References Cited

U.S. PATENT DOCUMENTS

| | | | |
|---|---|---|---|
| 4,510,489 | 4/1985 | Anderson, III et al. | 340/572 |
| 5,252,144 | 10/1993 | Martis | 148/121 |
| 5,469,140 | 11/1995 | Liu et al. | 340/551 |
| 5,494,534 | 2/1996 | Leu | 148/108 |

*Primary Examiner*—Glen Swann
*Attorney, Agent, or Firm*—Robin, Blecker, Daley & Driscoll

[57] ABSTRACT

A two-step continuous annealing process is applied to an amorphous metal alloy ribbon. During the first annealing step, a saturating transverse magnetic field is applied, and the field is omitted during the second annealing step. After the two annealing steps, the material is cut into discrete strips suitable for use as active elements in pulsed-field magnetomechanical EAS markers. The resulting markers exhibit satisfactory total frequency shift and ring-down signal amplitude characteristics, without excessive sensitivity to bias field variations.

49 Claims, 8 Drawing Sheets

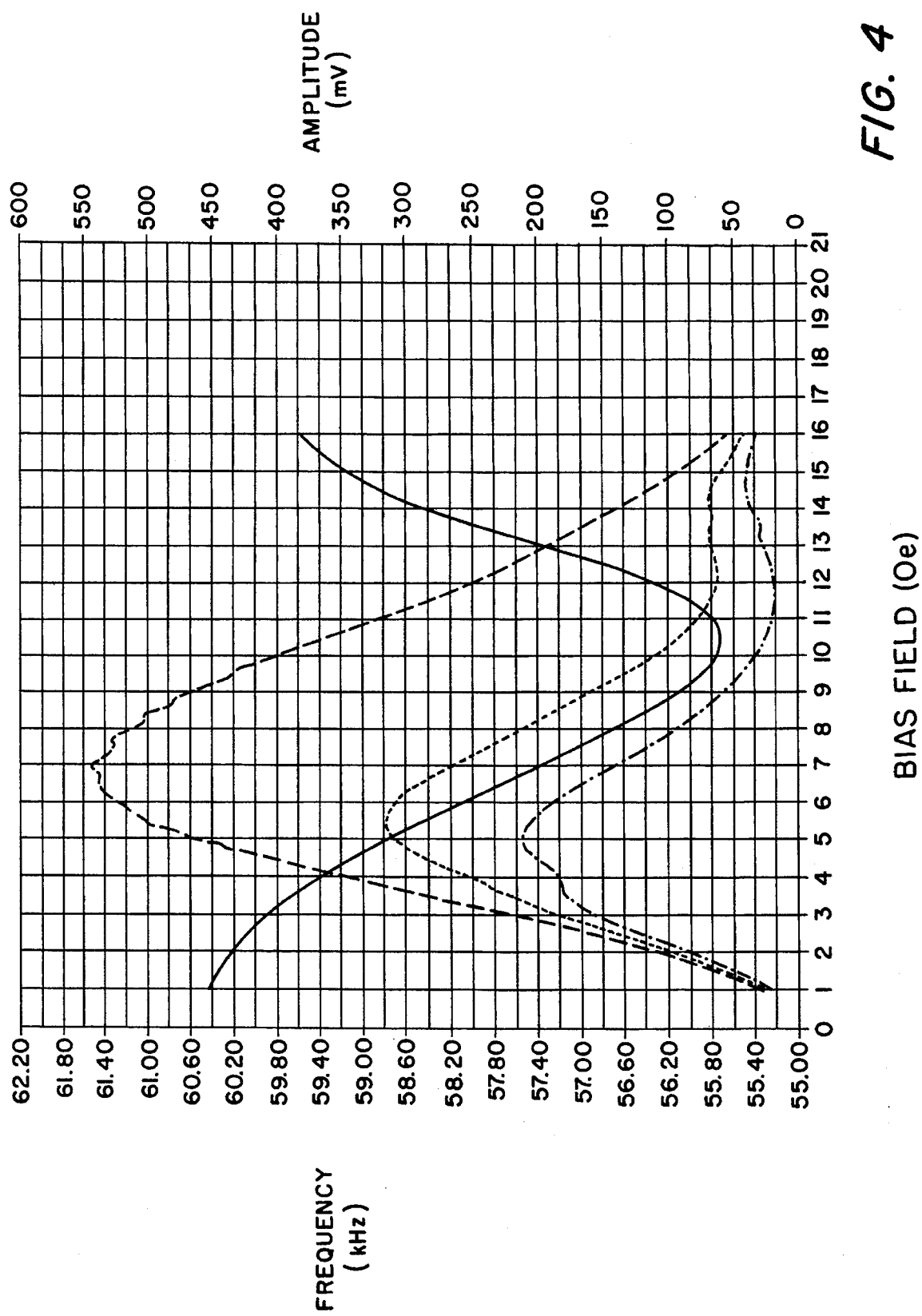

TWO-STAGE ANNEALING PROCESS FOR AMORPHOUS RIBBON USED IN AN EAS MARKER

CROSS-REFERENCE TO RELATED APPLICATIONS

This application is a continuation-in-part of application Ser. No. 08/269,651 filed Jun. 30, 1994, U.S. Pat. No. 5,469,140, and is also a continuation-in-part of prior application Ser. No. 08/392,070 filed Feb. 22, 1995, and is further a continuation-in-part of co-pending prior application Ser. No. 08/420,757 filed Apr. 12, 1995, all of which prior applications have a common inventor and a common assignee with the present application.

FIELD OF THE INVENTION

This invention relates to a method and apparatus for forming active elements to be used in markers for magnetomechanical electronic article surveillance systems and, more particularly, to such a method and apparatus in which an amorphous metal alloy material is heat-treated in the presence of a magnetic field.

BACKGROUND OF THE INVENTION

U.S. Pat. No. 4,510,489, issued to Anderson et al., discloses a magnetomechanical electronic article surveillance (EAS) system in which markers incorporating a magnetostrictive active element are secured to articles to be protected from theft. The active elements are formed of a soft magnetic material, and the markers also include a control element which is biased or magnetized to a pre-determined degree so as to provide a bias field which causes the active element to be mechanically resonant at a pre-determined frequency. The markers are detected by means of an interrogation signal generating device which generates an alternating magnetic field at the pre-determined resonant frequency, and the signal resulting from the mechanical resonance is detected by receiving equipment.

According to one embodiment disclosed in the Anderson et al. patent, the interrogation signal is turned on and off, or "pulsed," and a "ring-down" signal generated by the active element after conclusion of each interrogation signal pulse is detected.

Typically, magnetomechanical markers are deactivated by degaussing the control element, so that the bias field is removed from the active element thereby causing a substantial shift in the resonant frequency of the active element.

The Anderson et al. patent discloses a number of materials that may be used for the active element, and also describes techniques used for treating the materials. The disclosed techniques include heat-treating (annealing) an amorphous material in a saturating magnetic field. The disclosure of the Anderson et al. patent is incorporated herein by reference.

U.S. Pat. No. 5,252,144, issued to Martis, discloses further materials said to be suitable for use as active elements in magnetomechanical EAS markers, as well as annealing processes (without application of a magnetic field) to be applied to the materials.

The above-referenced '651 co-pending application discloses a procedure in which batches of pre-cut strips of an amorphous metal alloy are annealed in the presence of a saturating transverse magnetic field. The resulting annealed strips are suitable for use as the active elements in magnetomechanical markers and have improved ring-down characteristics which enhance performance in pulsed magnetomechanical EAS systems. In addition, the hysteresis loop characteristic of the resulting active element is such as to eliminate or reduce false alarms that may result from exposure to harmonic EAS systems. Moreover, the procedure disclosed in the '651 application produces active elements that are relatively flat in longitudinal profile, permitting fabrication of quite thin markers incorporating such active elements. The disclosure of the aforesaid application Ser. No. 08/269,651 is incorporated herein by reference.

The above-referenced '757 co-pending application discloses an adaptation of the techniques of the '651 application, in which a continuous process is employed to transport a continuous ribbon of amorphous metal alloy from reel to reel through an oven in which transverse-field annealing is carried out. Then, after annealing, the continuous ribbon is cut into discrete strips. This continuous annealing process avoids inconvenience in transporting pre-cut strips into and out of an oven.

The techniques disclosed in the '651 and '757 copending applications represent advances over previously known techniques. However, it would be desirable to modify the techniques of those two co-pending applications so as to provide active elements for EAS markers having a resonant frequency that is relatively insensitive to variations in the biasing magnetic field.

OBJECTS AND SUMMARY OF THE INVENTION

It is an object of this invention to provide a technique for manufacturing EAS marker active elements that are not prone to producing false alarms in harmonic EAS systems and have a flat profile.

It is also an object of the invention to increase the stability of the resonant frequency of such active elements relative to changes in biasing magnetic field.

It is a further object of the invention to provide a method and apparatus for conveniently manufacturing EAS marker active elements having relatively stable resonant frequencies as well as low susceptibility to false alarms in harmonic EAS systems and a flat profile.

According to an aspect of the invention, there is provided a method of fabricating a marker for use in an electronic article surveillance system, including the steps of first annealing a strip of magnetostrictive material during application of a magnetic field directed transverse to a longitudinal axis of the strip, with the strip having a characteristic upon completion of the first annealing such that, upon application of a biasing magnetic field to the strip, the strip is mechanically resonant at a resonant frequency in response to exposure to an alternating magnetic field at the resonant frequency, with the resonant frequency being subject to variation in dependence on changes in the biasing magnetic field, and the method further including the step, performed subsequent to the first annealing step, of second annealing the strip to reduce a rate at which the resonant frequency varies in dependence on changes in the biasing magnetic field.

Further in accordance with this aspect of the invention, the second annealing is preferably performed at a temperature of less than about 420° Centigrade and the second annealing is performed within a period of not more than 150 seconds.

According to another aspect of the invention, there is provided a method of fabricating a marker for use in an electronic article surveillance system, including the steps of first annealing a strip of magnetostrictive material during application of a saturating magnetic field, and, subsequent to the first annealing, second annealing the strip in the absence of the saturating magnetic field.

According to still another aspect of the invention, there is provided a method of forming a magnetostrictive element for use in an magnetomechanical electronic article surveillance marker, including the steps of providing a continuous strip of amorphous metal alloy, transporting the continuous amorphous strip through an annealing region in which heat and a saturating magnetic field are applied to anneal the ribbon; further annealing the continuous alloy strip in the absence of the saturating magnetic field, and, after the steps of transporting and further annealing, cutting the annealed strip into discrete strips each having a predetermined length.

According to a further aspect of the invention, there is provided a method of forming a magnetostrictive element for use in a magnetomechanical electronic article surveillance marker, including the steps of providing a continuous strip of amorphous metal alloy; transporting the continuous amorphous alloy strip through an annealing region in which heat and a saturating magnetic field are applied to anneal the ribbon; after the transporting step, cutting the annealed strip into discrete strips, each having a predetermined length; and further annealing the discrete strips in the absence of the saturating magnetic field.

In accordance with yet another aspect of the invention, there is provided an apparatus for annealing a continuous strip of an amorphous metal alloy, including an oven, a magnetic field element for forming a magnetic field that is present in substantially all of a first region of the oven, with the magnetic field being substantially absent from a second region of the oven, and a transport mechanism for transporting the continuous strip along a path through the first region of the oven and through the second region of the oven.

Further in accordance with the latter aspect of the invention, the transport means transports the continuous strip through the first region in a direction towards the second region.

Still further in accordance with this aspect of this invention, the apparatus may include a supply reel, located at one side of the oven, with the continuous strip being unwound from the supply reel for being supplied to the oven, and a take-up reel, located at an opposite side of the oven from the supply reel, with the continuous strip being wound on the take-up reel after passing through the oven.

In addition, the transport mechanism may include a capstan and a pinch roller, both interposed between the oven and the take-up reel, with the continuous strip being engaged between the capstan and pinch roller and being driven by the capstan in a direction from the supply reel to the take-up reel. Further, the magnetic field element forms the magnetic field in a direction transverse to the path through the oven and the magnetic field is formed with a field strength of at least 800 Oe inside the oven. Still further, the continuous strip may be in the form of a continuous ribbon, and the apparatus may further include a fixture located in the oven, with the ribbon being drawn through the fixture for imparting a desired cross-sectional profile to the ribbon. The fixture may include a curl surface for imparting a curved cross-sectional profile to the ribbon. Alternatively, the fixture may include a flat guide surface for imparting a substantially flat cross-sectional profile to the ribbon.

According to still another aspect of the invention, there is provided an apparatus for annealing a continuous strip of an amorphous metal alloy, including an element for forming a first heated region, a magnetic field element for forming a magnetic field that is present in substantially all of the first heated region, an element for forming a second heated region from which the magnetic field is substantially absent, and a transport mechanism for transporting the continuous strip along a path through the first and second regions. The element for forming the first heated region may be a first oven and the element for forming the second heated region may be a second oven different from the first oven. Alternatively, a single oven may constitute both of the element for forming the first heated region and the element for forming the second heated region.

According to a further aspect of the invention, there is provided a magnetostrictive element for use in a magnetomechanical electronic article surveillance marker, with the element being formed by first annealing an amorphous metal alloy in the presence of a saturating magnetic field, and then second annealing the amorphous metal alloy in the absence of the saturating magnetic field. The second annealing may be performed at a temperature less than about 420° C. and within a period of not more than 150 seconds.

According to still a further aspect of the invention, there is provided a magnetostrictive element for use in a magnetomechanical electronic article surveillance marker, formed by first annealing a continuous strip of an amorphous metal alloy in the presence of a saturating magnetic field, then second annealing the continuous strip in the absence of the saturating magnetic field, and then cutting the twice-annealed continuous strip into discrete strips.

According to yet another aspect of the invention, there is provided a marker for use in a magnetomechanical electronic article surveillance system, including a discrete amorphous magnetostrictive strip formed by first annealing an amorphous metal alloy in the presence of a saturating magnetic field and then second annealing the amorphous metal alloy in the absence of the saturating magnetic field.

According to still another aspect of the invention, there is provided a marker for use in a magnetomechanical electronic article surveillance system, including a discrete amorphous magnetostrictive strip formed by first annealing a continuous strip of an amorphous metal alloy in the presence of a saturating magnetic field, then second annealing the continuous strip in the absence of the saturating magnetic field, and then cutting the twice-annealed continuous strip into discrete strips.

According to a further aspect of the invention, there is provided a magnetomechanical electronic article surveillance system, including generating circuitry for generating an electromagnetic field alternating at a selected frequency in an interrogation zone, with the generating circuitry including an interrogation coil, a marker secured to an article appointed for passage through the interrogation zone, with the marker including an amorphous magnetostrictive element formed by first annealing an amorphous metal alloy in the presence of a saturating magnetic field and then second annealing the amorphous metal alloy in the absence of the saturating magnetic field, the marker also including a biasing element located adjacent to the magnetostrictive element, the biasing element being magnetically biased to cause the magnetostrictive element to be mechanically resonant when exposed to the alternating field, the system also including detecting means for detecting the mechanical resonance of the magnetostrictive element.

According to yet another aspect of the invention, there is provided a magnetomechanical electronic article surveillance system, including generating circuitry for generating an electromagnetic field alternating at a selected frequency in an interrogation zone, the generating circuitry including an interrogation coil, and a marker secured to an article appointed for passage through the interrogation zone, the marker including an amorphous magnetostrictive element formed by first annealing a continuous strip of an amorphous metal alloy in the presence of a saturating magnetic field, then second annealing the continuous strip in the absence of the saturating magnetic field, and then cutting the twice-annealed continuous strip into discrete strips, the marker including a biasing element located adjacent to the magnetostrictive element, the biasing element being magnetically biased to cause the magnetostrictive element to be mechanically resonant when exposed to the alternating field. The system also includes detecting circuitry for detecting the mechanical resonance of the magnetostrictive element.

According to still another aspect of the invention, there is provided a marker for use in a magnetomechanical electronic article surveillance system, including an amorphous magnetostrictive element and a biasing element located adjacent to the magnetostrictive element, with the magnetostrictive element having a hysteresis loop characteristic such that the magnetostrictive element does not produce substantial detectable harmonic frequencies when in an alternating electromagnetic field, and the magnetostrictive element also has a resonant-frequency-to-bias-field slope characteristic of less than about 700 Hz/Oe in a bias field range of 5 Oe to 7 Oe. Further in accordance with the latter aspect of the invention, the resonant-frequency-to-bias-field slope characteristic of the magnetostrictive element may be less than 500 Hz/Oe in the bias field range of 5 Oe to 7 Oe.

According to yet another aspect of the invention, there is provided a marker for use in a magnetomechanical electronic article surveillance system, including a magnetostrictive element having a resonant-frequency-to-bias-field slope characteristic of less than about 700 Hz/Oe in a bias field range of 5 Oe to 7 Oe, the marker having an overall thickness of less than 0.065 inches.

Further in accordance with the latter aspect of the invention, the resonant-frequency-to-bias-field slope characteristic of the magnetostrictive element may be less than 500 Hz/Oe in the bias field range of 5 Oe to 7 Oe, and the overall thickness of the marker may be less than 0.030 inches, and may be about 0.005 inches.

BRIEF DESCRIPTION OF THE DRAWINGS

FIG. 4 is a graphical representation of variations in resonant frequency and output signal amplitude resulting from changes in a bias field applied to an amorphous metal alloy that is subjected only to a single annealing step.

DESCRIPTION OF PREFERRED EMBODIMENTS

Figure 1:
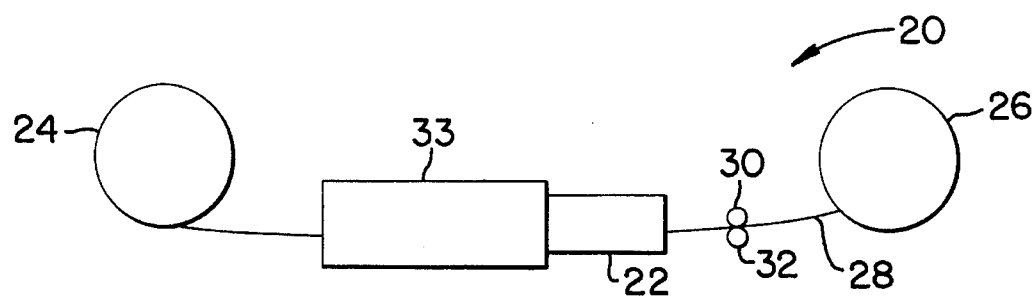
FIG. 1 is a side view of a processing apparatus provided in accordance with the invention.
Figure 2:
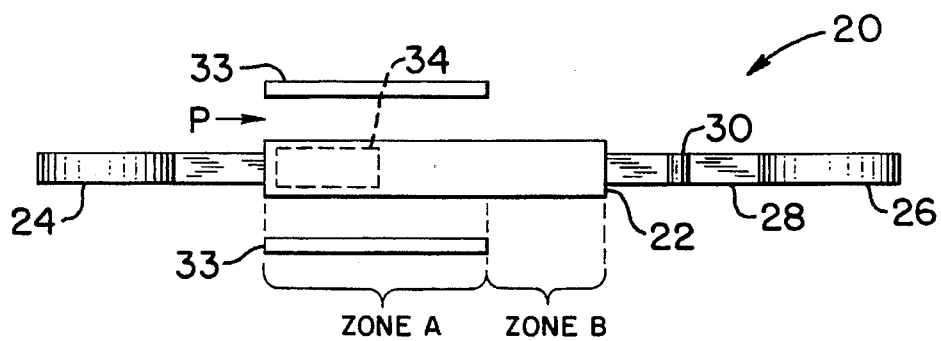
FIG. 2 is a top view of the processing apparatus of FIG. 1.

There will now be described, with initial reference to FIGS. 1 and 2, a method and apparatus provided in accordance with the invention for forming the active elements of magnetomechanical EAS markers using a two-step annealing process that yields an active element having a resonant frequency that is relatively insensitive to variations in applied bias field. It is to be noted that FIG. 1 is a side view of the apparatus and FIG. 2 is a top view of the apparatus.

Reference numeral 20 generally indicates the processing apparatus. The processing apparatus includes an oven 22, and supply and take-up reels 24, 26 provided at opposite sides of the oven 22. A continuous ribbon 28 of amorphous metal is unwound from the supply reel 24 and transported along a path P through the oven 22 and then is taken up on the take-up reel 26. The ribbon 28 is engaged between a capstan 30 and a pinch roller 32 positioned between the oven 22 and the take-up reel 26. The capstan 30, in cooperation with the pinch roller 32, draws the ribbon 28 along its path P through the oven 22.

Arrays 33 of permanent magnets are provided alongside the oven 22 so as to generate a magnetic field, within the oven 22, that is transverse to the longitudinal axis of the ribbon 28. It will be observed that the arrays 33 of permanent magnets do not extend along the entire length of the oven 22. Rather, the arrays 33 are provided so that the magnetic field is present in substantially all of a first zone A within the oven 22, but the magnetic field generated by the magnet arrays 33 is substantially absent from a second zone B in the oven 22. Zone B is downstream from zone A along the path of travel P.

It is to be understood that the foregoing arrangement of the magnetic arrays 33 relative to the oven 22 results in the ribbon 28 being subjected to a two-step annealing process in which, during a first step, the ribbon is annealed in the presence of a transverse magnetic field, whereas in the second step the ribbon 28 is further annealed in the absence of the magnetic field.

The field generated by the magnet arrays 33 should be strong enough so that the magnetic field formed in zone A is saturating for the material making up the ribbon 28. Depending on the material used, the optimum field may be in excess of 800 Oe, and a field as strong as 1,000 Oe may be necessary to achieve saturation.

The oven 22 may be of a conventional type, and preferably has the capability of maintaining different temperatures in zone A and B. The length of the path of travel of the ribbon 28 in zone B relative to the length of the path of travel in zone A is determined according to the desired length of time during which the second annealing step is to be performed relative to the duration of the first annealing step. The duration of each annealing step is the product of two parameters: length of the path of travel through the respective zone and the speed at which the ribbon 28 is transported through the oven 22. According to a preferred arrangement of the apparatus 20, the total length of the path of travel through the oven 22 is about 231.1 cm. Although it is most convenient to provide both zone A (transverse-field annealing) and zone B, (second-stage annealing, without applied field) within a single oven, it is also contemplated that zone A could be provided in a first oven, and zone B provided in a second oven separate from, and downstream from, the first oven.

Figure 3:
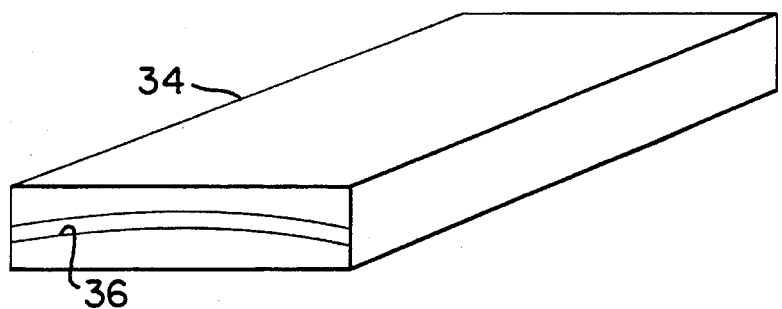
FIG. 3 is a perspective view of a curling fixture employed in the processing apparatus of FIGS. 1 and 2.

A curling fixture 34 is optionally provided within the oven 22 for the purpose of imparting a transverse curl to the ribbon 28. As best seen in FIG. 3, the fixture 34 has a curl surface 36 which, proceeding in a direction transverse to the longitudinal axis of the ribbon 28, rises and then falls. The fixture 34, if present, may be placed in zone A of the oven 22, extending substantially halfway along the length of zone A. Alternatively, the fixture 34 may be placed in zone B, or may extend within both zones A and B. The ribbon 28 is drawn longitudinally through the fixture 34, and the heating applied to the ribbon 28 during its passage through the fixture 34 causes the ribbon 28 to conform itself to the curl surface 36, thereby imparting a transverse curve to the ribbon 28. The result of the treatment is that cut strips subsequently produced from the ribbon 28 have a curve transverse to the longitudinal axis of the strips, in correspondence to the curl surface 36. The transversely-curved active elements are provided to reduce or avoid a clamping effect that might otherwise occur when the active element is mounted in the EAS marker in proximity to a magnetic biasing element.

The curl surface 36, if employed, is preferably contoured so as to impart to the ribbon 28 a curve which has a height at its crown that is about 0.0127 cm to 0.0254 cm above the transverse edges of the ribbon 28.

Figure 3A:
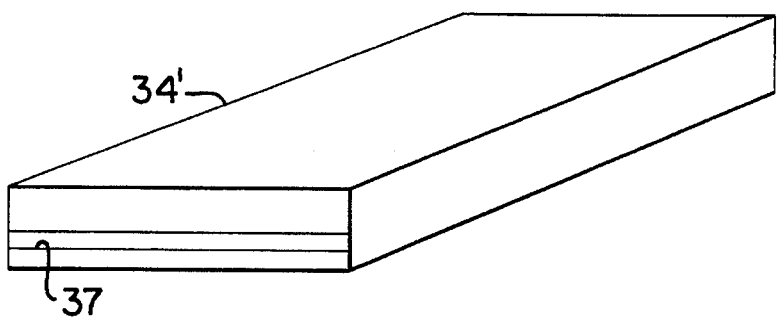
FIG. 3A is a perspective view of a fixture that may alternatively be employed in the processing apparatus so as to impart a flat cross-sectional profile to a metal ribbon processed in the processing apparatus.

As an alternative to the fixture 34 shown in FIG. 3, there can be provided a fixture 34' (shown in FIG. 3A) with a flat guide surface 37 instead of a curved surface, so as to produce active elements that are substantially flat sections cut from the ribbon 28. As indicated in the above-referenced '651 application, annealing the material on a flat surface tends to eliminate longitudinal curling in the active element and makes it possible to reduce the overall height of the EAS marker.

Reel motors (not shown) are respectively provided for the supply reel 24 and the take-up reel 26. The take-up reel motor is operated so that the ribbon 28 is taken up, upon emerging from the capstan 30 and the pinch roller 32, with little or no slack and a modest amount of tension, and the motor for the supply reel 24 is also operated so as to minimize both slack and tension in the ribbon 28 while it passes through the oven 22. The speed of operation of the reel motors may be controlled by a human operator, or an automatic control system may be provided.

Upon completion of the two-step annealing process illustrated in FIGS. 1 and 2, the twice-annealed continuous ribbon is cut into strips according to a conventional technique. However, the magnetic properties imparted by the annealing process in accordance with the invention are more uniform than the properties exhibited by conventional as-cast amorphous ribbons, so that the magnetic properties of the material need not be measured, nor the cut-length of the strips adjusted, as frequently as is required when cutting ascast amorphous ribbon.

Before turning to specific examples of the application of the inventive two-step annealing process, it should be noted that two-step annealing in accordance with the invention need not be performed with a continuous process. That is, either the second annealing step, or both the first and second annealing steps, can be applied to pre-cut discrete strips rather than to a continuous ribbon.

Particular examples of the inventive process will now be described.

EXAMPLE 1

A continuous amorphous ribbon having the composition $Fe_{32}CO_{18}Ni_{32}B_{13}Si_5$ (atomic percent) was annealed at 400° C. for 22 seconds in a saturating transverse magnetic field. The ribbon had a width of about 12.7 mm and a thickness of about 0.025 mm. After the first (transverse-field) annealing step, the ribbon was cut into strips having a length of 37.75 millimeters and the cut strips were then further annealed at 340° C. for 1 minute while being maintained in a stationary position in a separate oven. During the second annealing step the saturating magnetic field was absent, but there was an ambient field of about 0.7 Oe in the longitudinal direction of the strips, due to the earth's magnetic field.

Figure 5:
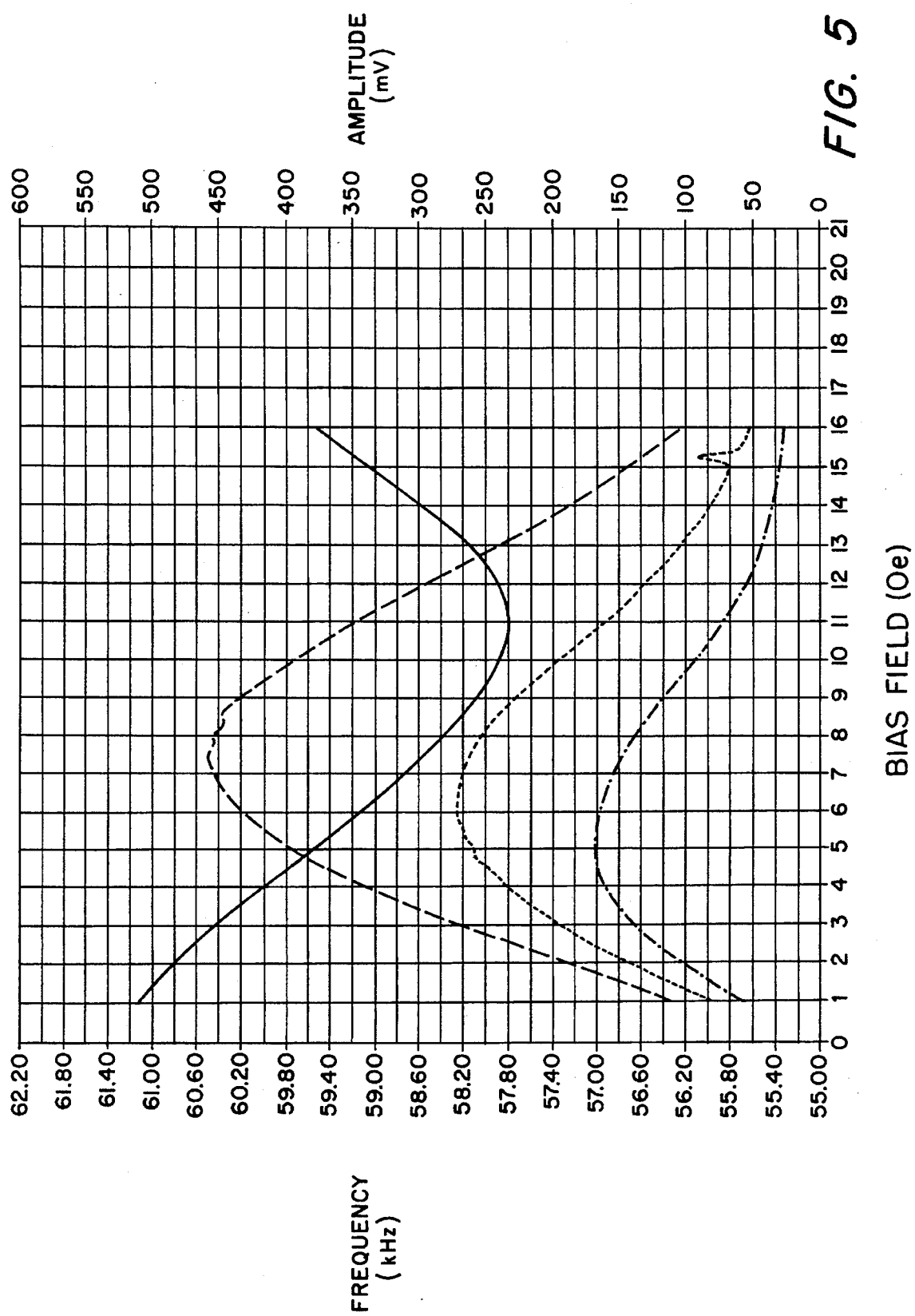
FIG. 5 is a graphical representation of variations in resonant frequency and output signal amplitude resulting from changes in a bias field applied to an amorphous metal alloy strip that is twice-annealed in accordance with the invention.

FIG. 4 illustrates magnetomechanical characteristics of the cut strips produced by the first (transverse-field) annealing step, and before application of the second annealing step, according to variations in bias field. FIG. 5 illustrates bias-field-dependent magnetomechanical characteristics of the strips produced by the entire two-step process. In both of FIGS. 4 and 5:

The solid-line curve illustrates changes in resonant frequency with variations in applied bias field.

The dashed-line curve illustrates output signal magnitude immediately at the end of an interrogation signal pulse, according to changes in the bias field.

The dotted-line curve illustrates output signal amplitude one millisecond after the end of the interrogation field pulse, according to changes in the bias field.

The dot-dash-line curve illustrates output signal amplitude two milliseconds after the end of the interrogation field pulse, according to changes in the bias field.

(The output signal amplitudes exhibited at and after the end of the interrogation signal pulse are sometimes referred to as "ring-down" amplitudes.)

As indicated by FIG. 4, for cut-strips which are only transverse-field annealed, the slope of the resonant-frequency-to-bias-field curve (solid-line curve) exhibits a slope of about 700 Hz/Oe between the 5 Oe and 7 Oe points. This slope is indicative of an excessive sensitivity in resonant frequency to changes in the bias field. This degree of sensitivity would tend to result in unreliable performance by markers using single-step annealed active elements. Specifically, variations in the orientation of the marker result in variations in the effective applied bias field because of the fact that the effect of the earth's magnetic field varies with orientation of the marker, and these variations are sufficient in some cases to shift the resonant frequency away from the predetermined frequency at which magnetomechanical EAS detection equipment operates.

It will be noted that the once-annealed cut strips provide a frequency shift of about 2.3 kHz when the bias field is decreased from 6 Oe to 1 Oe and a ring-down amplitude at 1 millisecond after the interrogation signal pulse of about 310 mV with an applied bias field of 6 Oe. Although the frequency shift and output amplitude characteristics of the once-annealed cut-strips are satisfactory, and the resonant frequency versus bias field curve slope is more favorable than that exhibited by the cobalt-rich material ($Fe_{39.5}Co_{39.5}Si_2B_{19}$) described in the above-referenced '651 application, still the sensitivity of resonant frequency to bias field variations is too great for reliable operation. However, the characteristics of the twice-annealed cut-strips, as shown in FIG. 5, provide for a significantly reduced slope of the resonant-frequency-to-bias-field curve at the cost of an acceptable reduction in the frequency shift and output amplitude characteristics. In particular, in the twice-annealed strips, the slope between the 5 Oe and 7 Oe points is reduced to about 420 Hz/Oe. The frequency shift is about 2.0 kHz, upon reduction of the bias field from 6 Oe to 1 Oe, and the ring-down amplitude at 1 millisecond is 275 mV with a 6 Oe bias field.

It is believed that the second annealing step, in the presence of only a minimal ambient magnetic field, serves to somewhat disperse the rather well defined magnetic domain boundaries produced by the transverse-field annealing step, thereby reducing the sensitivity of the resonant frequency of the material to changes in the bias field. As a result, the twice-annealed material, when incorporated as an active element in pulsed magnetomechanical EAS markers, exhibits an acceptable degree of reliability, notwithstanding the inevitable variations in effective applied bias field.

EXAMPLE 2

Figure 6:
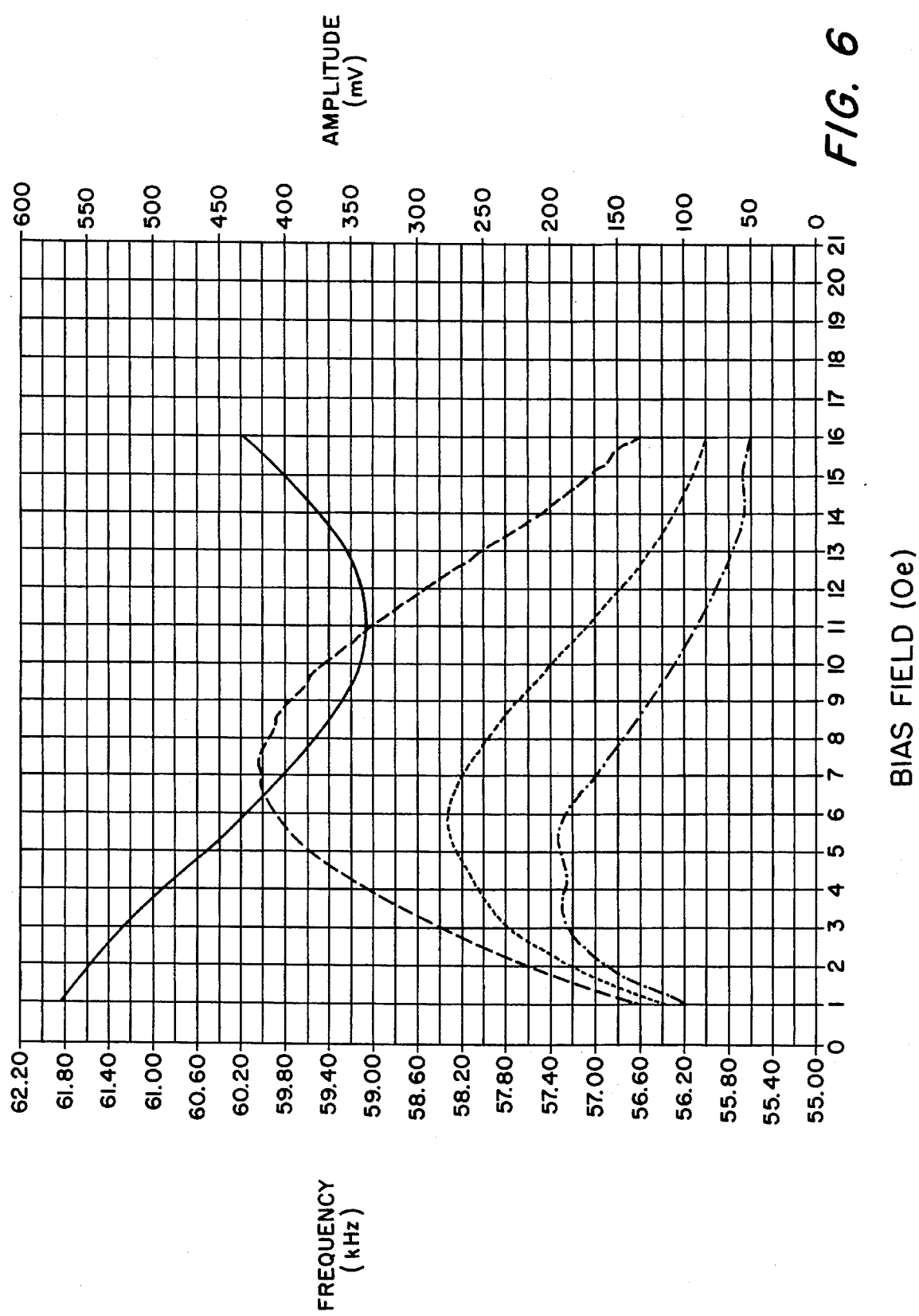
FIG. 6 is a graphical representation of variations in resonant frequency and output signal amplitude resulting from changes in a bias field applied to an amorphous metal alloy strip formed according to another example of the inventive process.

The same process was applied to the same material as in Example 1, except that the duration of the second annealing step was 2 minutes rather than 1 minute. FIG. 6 illustrates the resulting magnetomechanical characteristics of the two-step annealed cut-strips with each of the four curves in FIG. 6 illustrating, respectively, the same characteristics as in FIG. 5. It will be noted that the increased duration of the second annealing step in this example has produced a less steep slope of the resonant-frequency-to-bias-field curve, the slope being approximately 350 Hz/Oe between the 5 Oe and 7 Oe points. The frequency shift was modestly reduced to 1.7 kHz for a bias field reduction from 6 Oe to 1 Oe, and the one-millisecond ring-down amplitude with a 6 Oe bias field is essentially unchanged at 280 mV.

EXAMPLE 3

A continuous ribbon having the same composition and dimensions described above in connection with Example 1 was two-step annealed using the continuous-process apparatus described above in connection with FIGS. 1 and 2. The path of travel of the continuous ribbon 28 in zone A (transverse-annealing zone) was 152.4 cm and the path of travel in zone B (second-step anneal; no applied field) was 78.7 cm. The continuous ribbon 28 was transported at a speed of about 7 centimeters per second, producing a duration of about 21 seconds for the first (transverse-field) annealing step and about 11 seconds for the second (field-absent) step. The path of travel P was substantially aligned in an east-west direction so that virtually no ambient longitudinal field was present in zone B. The temperature in zone A was fixed at 380° C., but the temperature in zone B was varied within a range of 320°–400° C. to obtain respective lots of samples. The continuous strip was cut into discrete strips (37.75 mm in length) after the two-step continuous annealing was carried out.

Figure 7:
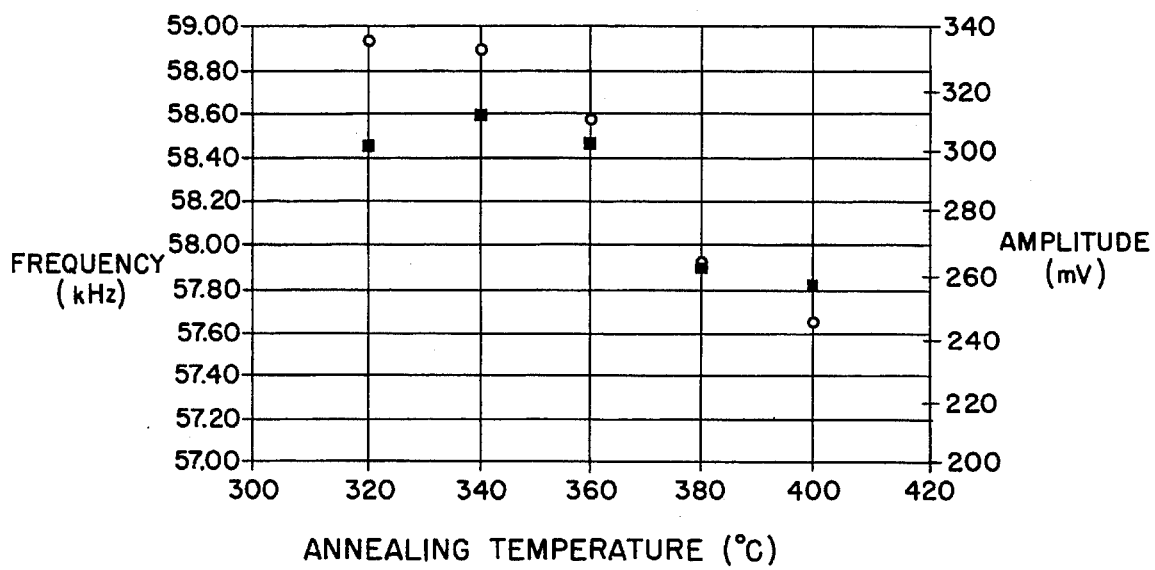
FIG. 7 is a graphical representation of variations in resonant frequency and output signal amplitude resulting from changes in the temperature applied to the amorphous metal alloy during the second step of a two-step annealing process.
Figure 8:
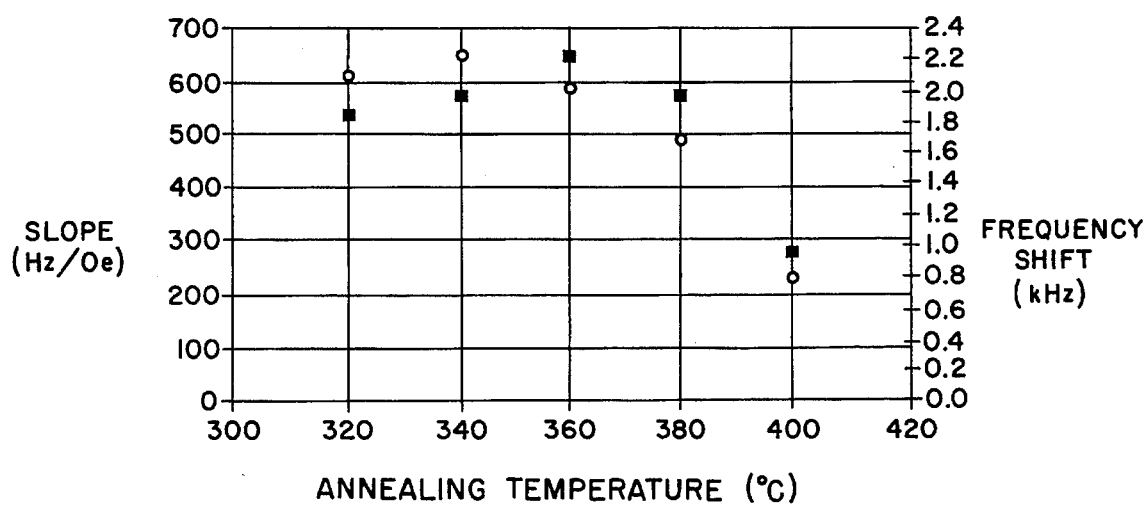
FIG. 8 is a graphical representation of variations in resonant frequency sensitivity to bias field changes, and total resonant frequency shift, resulting from changes in the temperature applied to the amorphous metal alloy during the second step of a two-step annealing process.

In FIG. 7, the shaded circles indicate resonant frequency values obtained (at a 5.5 Oe bias field) for each of the second-step annealing temperatures, and the solid squares indicate the 1-millisecond ring-down amplitudes (at a 5.5 Oe bias field) obtained with the various second-step annealing temperatures. In FIG. 8, the shaded circles indicate the resonant-frequency-to-bias-field dependency characteristic (i.e., the slope), and the solid squares indicate the resonant frequency shift (upon reduction of bias field from 6 Oe to 1 Oe), obtained at the various second-step annealing temperatures.

As indicated by FIG. 7, the resonant frequency at 5.5 Oe decreases for second-step annealing temperatures above 340° and the 1 millisecond ring-down amplitude (also at a 5.5 Oe bias field) decreases for temperatures above 360° C. FIG. 8 illustrates how the resonant frequency/bias field slope (between the 5 and 7 Oe points) and the total frequency shift (from 6 to 1 Oe) varies depending on the second-step annealing temperature. In general, the slope decreases from about 610–650 Hz/Oe to about 230 Hz/Oe, as the second-step annealing temperature is increased from 320° to 400° C. The frequency shift initially increases, and then decreases when the second-step annealing temperature is greater than 360° C. A satisfactory trade-off of resonant frequency/bias field slope versus total frequency shift is obtained with a second step annealing temperature of 380° C., yielding the following characteristics: 1 millisecond ring-down—263 mV, resonant frequency/bias field slope—488 Hz/Oe, frequency shift—1.970 kHz.

EXAMPLE 4

Figure 9:
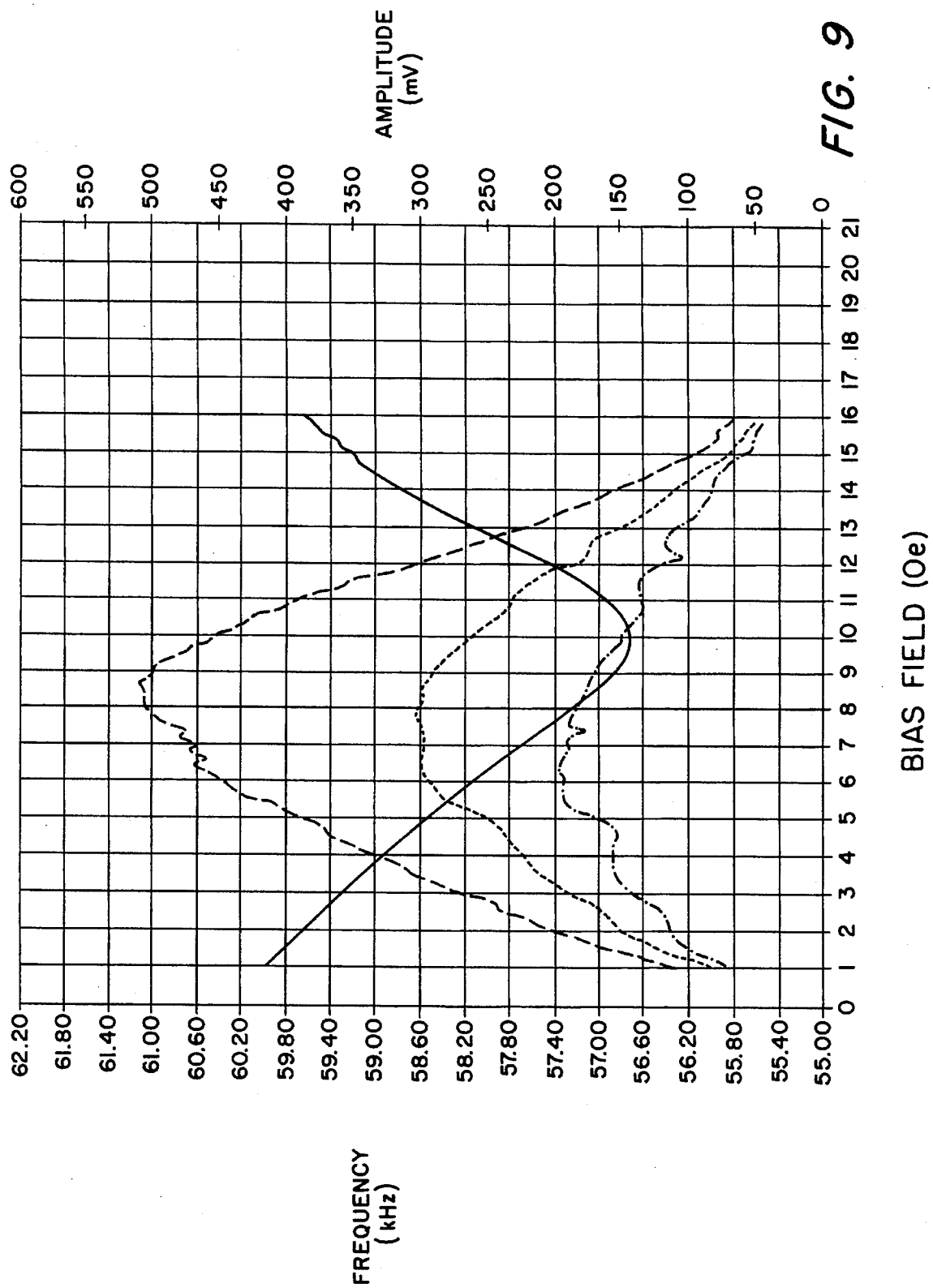
FIG. 9 is a graphical representation of variations in resonant frequency and output signal amplitude resulting from changes in a bias field applied to an amorphous metal alloy strip formed according to another example of the inventive process.
Figure 10:
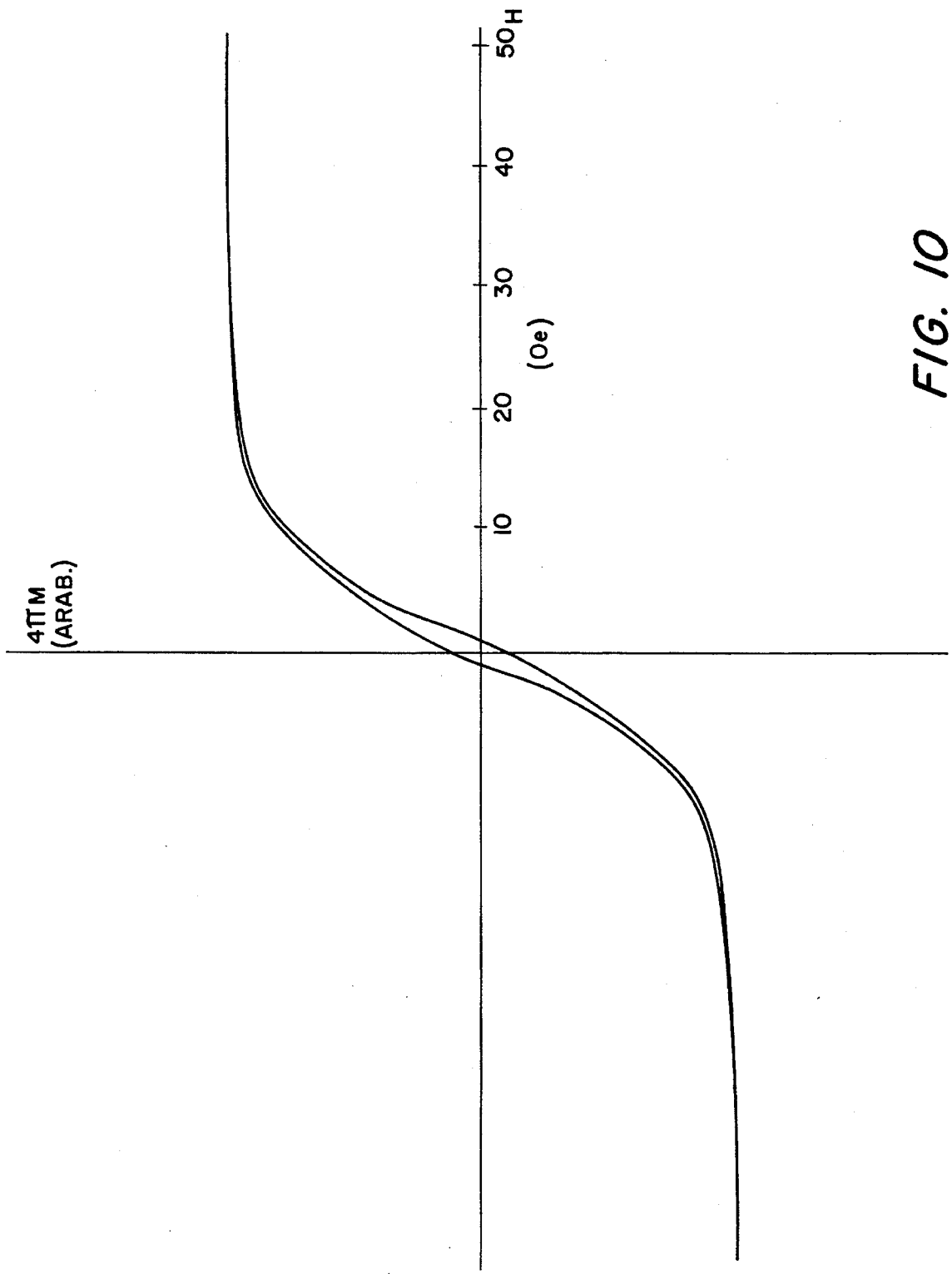
FIG. 10 illustrates an M-H loop characteristic of a metal alloy strip formed according to the latter example of the inventive process.

The same material and the same two-step continuous annealing apparatus as in Example 3 were used. The alloy ribbon transport speed was reduced by a factor of about two, and the following annealing parameters were employed: first (transverse field) step—43 seconds at 380° C.; second (field-absent) step—22 seconds at 360° C. After cutting the two-step annealed continuous strip into discrete strips as in the previous example, characteristics as shown in FIG. 9 were obtained. The four curves shown in FIG. 9 illustrate, respectively, the same characteristics discussed in connection with FIGS. 5 and 6 above. It will be noted that the slope of the resonant frequency/bias field curve is about 430 Hz/Oe between the 5 and 7 Oe points. The 1 millisecond ring-down amplitude is 290 mV at a 6 Oe bias field, and the frequency shift is 1.830 kHz when the bias field is reduced from 6 Oe to 1 Oe. An M-H loop characteristic of the resulting two-step annealed cut-strip material is shown in FIG. 10.

It will be observed that the M-H loop is somewhat open near the origin, indicating that the treated material is somewhat susceptible to causing false alarms in harmonic EAS systems, although less so than conventional magnetomechanical markers which employ as-cast (i.e., non-annealed) active elements.

In each of the examples given above, a material having the same composition was used. However, it is believed that satisfactory results can be obtained with other compositions, having a proportion of cobalt ranging from 5 to 45% by atomic percent, provided that the material also includes a substantial proportion of nickel.

Also, although it is preferred that no field other than an ambient magnetic field provided by the earth's magnetic field be provided during the second annealing step, it is believed that satisfactory results can also be obtained by providing a magnetic field of less than 1 Oe in the longitudinal direction of the continuous strip or discrete strips during the second annealing step.

It is also believed that satisfactory results will not be obtained if the second (field-absent) annealing step is carried out at a temperature of more than 420° C. or with a duration of more than 90 seconds.

As noted above, the two-step annealing process disclosed herein, and particularly the provision of a second annealing step, carried out substantially without any magnetic field, after an initial saturating transverse-field annealing step, permits fabrication of active elements for magnetomechanical EAS markers having a resonant frequency that is not unduly sensitive to small variations in the bias field. At the same time, active elements produced in this manner exhibit satisfactory characteristics in terms of overall frequency shift and ring-down signal amplitude. Also, the active elements can be made to have flat profiles and have reduced susceptibility to causing false alarms in harmonic EAS systems.

Figure 11:
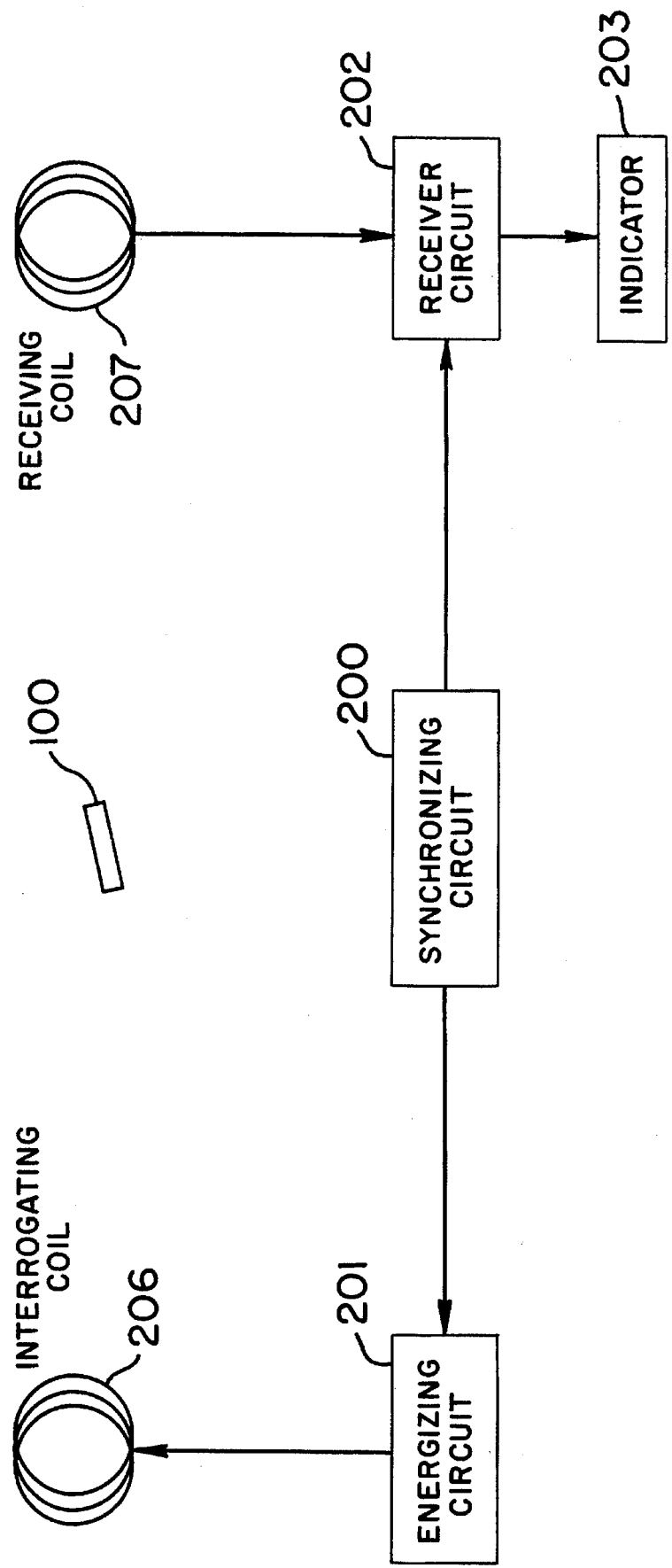
FIG. 11 is a schematic block diagram of an electronic article surveillance system which uses a magnetomechanical marker incorporating an active element formed in accordance with the invention.

FIG. 11 illustrates a pulsed-interrogation EAS system which uses a magnetomechanical marker 100 that incorporates an active element produced in accordance with the invention. The system shown in FIG. 11 includes a synchronizing circuit 200 which controls the operation of an energizing circuit 201 and a receive circuit 202. The synchronizing circuit 200 sends a synchronizing gate pulse to the energizing circuit 201, and the synchronizing gate pulse activates the energizing circuit 201. Upon being activated, the energizing circuit 201 generates and sends an interrogation signal to interrogating coil 206 for the duration of the synchronizing pulse. In response to the interrogation signal, the interrogating coil 206 generates an interrogating magnetic field, which, in turn, excites the marker 100 into mechanical resonance.

Upon completion of the interrogation signal pulse, the synchronizing circuit 200 sends a gate pulse to the receiver circuit 202, and the latter gate pulse activates the circuit 202. During the period that the circuit 202 is activated, and if a marker is present in the interrogating magnetic field, such marker will generate in the receiver coil 207 a signal at the frequency of the mechanical resonance of the marker. This signal is sensed by the receiver 202, which responds to the sensed signal by generating a signal to an indicator 203 to generate an alarm or the like. In short, the receiver circuit 202 is synchronized with the energizing circuit 201 so that the receiver circuit 202 is only active during quiet periods between the pulses of the pulsed interrogation field.

Various changes in the foregoing annealing apparatus and modifications in the described practices may be introduced without departing from the invention. The particularly preferred embodiments of the invention are thus intended in an illustrative and not limiting sense. The true spirit and scope of the invention is set forth in the following claims.

What is claimed is:

1. A method of fabricating a marker for use in an electronic article surveillance system, comprising the steps of:

first annealing a strip of magnetostrictive material during application of a magnetic field directed transverse to a longitudinal axis of the strip, said strip having a characteristic upon completion of said first annealing such that, upon application of a biasing magnetic field to the strip, the strip is mechanically resonant at a resonant frequency in response to exposure to an alternating magnetic field at said resonant frequency, said resonant frequency being subject to variation in dependence on changes in said biasing magnetic field; and subsequent to said first annealing, second annealing the strip to reduce a rate at which said resonant frequency varies in dependence on changes in said biasing magnetic field.

2. A method according to claim 1, wherein said second annealing is performed at a temperature of less than about 420° centigrade.

3. A method according to claim 1, wherein said second annealing is performed within a period of not more than 150 seconds.

4. A method of fabricating a marker for use in an electronic article surveillance system, comprising the steps of:

first annealing a strip of magnetostrictive material during application of a saturating magnetic field; and subsequent to said first annealing, second annealing the strip in the absence of said saturating magnetic field.

5. A method according to claim 4, wherein said saturating magnetic field is directed transverse to a longitudinal axis of the strip.

6. A method according to claim 4, wherein said second annealing is performed at a temperature of less than about 420° centigrade.

7. A method according to claim 4, wherein said second annealing is performed within a period of not more than 150 seconds.

8. A method of forming a magnetostrictive element for use in a magnetomechanical electronic article surveillance marker, comprising the steps of:

providing a continuous strip of amorphous metal alloy;

transporting the continuous amorphous alloy strip through an annealing region in which heat and a saturating magnetic field are applied to anneal the ribbon;

further annealing the continuous alloy strip in the absence of said saturating magnetic field; and after said steps of transporting and further annealing, cutting the annealed strip into discrete strips each having a predetermined length.

9. A method according to claim 8, wherein said step of further annealing the continuous strip is performed at a temperature of less than about 420° centigrade.

10. A method according to claim 8, wherein said step of further annealing the continuous strip is performed within a period of not more than 150 seconds.

11. A method of forming a magnetostrictive element for use in a magnetomechanical electronic article surveillance marker, comprising the steps of:

providing a continuous strip of amorphous metal alloy;

transporting the continuous amorphous alloy strip through an annealing region in which heat and a saturating magnetic field are applied to anneal the ribbon;

after said transporting step, cutting the annealed strip into discrete strips each having a predetermined length; and further annealing the discrete strips in the absence of said saturating magnetic field.

12. A method according to claim 11, wherein said step of further annealing the discrete strips is performed at a temperature of less than about 420° centigrade.

13. A method according to claim 11, wherein said step of further annealing the discrete strips is performed within a period of not more than 150 seconds.

14. An apparatus for annealing a continuous strip of an amorphous metal alloy, comprising:

an oven;

magnetic field means for forming a magnetic field that is present in substantially all of a first region of said oven, said magnetic field being substantially absent from a second region of said oven; and transport means for transporting the continuous strip along a path through said first region of said oven and through said second region of said oven.

15. An apparatus according to claim 14, wherein said transport means transports the continuous strip through said first region in a direction towards said second region.

16. An apparatus according to claim 14, further comprising:

a supply reel, located at one side of said oven, the continuous strip being unwound from said supply reel for being supplied to said oven; and a take-up reel, located at an opposite side of said oven from said supply reel, the continuous strip being wound on said take-up reel after passing through said oven.

17. An apparatus according to claim 16, wherein said transport means includes a capstan and a pinch roller, both interposed between said oven and said take-up reel, the continuous strip being engaged between said capstan and pinch roller and being driven by the capstan in a direction from said supply reel to said take-up reel.

18. An apparatus according to claim 14, wherein said magnetic field means forms said magnetic field in a direction transverse to said path through said oven.

19. An apparatus according to claim 18, wherein said magnetic field is formed with a field strength of at least 800 Oe inside said oven.

20. An apparatus according to claim 14, wherein the continuous strip is in the form of a continuous ribbon, and further comprising a fixture located in said oven and through which the ribbon is drawn for imparting a desired cross-sectional profile to the ribbon.

21. An apparatus according to claim 20, wherein said fixture includes a curl surface for imparting a curved cross-sectional profile to the ribbon.

22. An apparatus according to claim 20, wherein said fixture includes a flat guide surface for imparting a substantially flat cross-sectional profile to the ribbon.

23. An apparatus for annealing a continuous strip of an amorphous metal alloy, comprising:

means for forming a first heated region;

magnetic field means for forming a magnetic field that is present in substantially all of said first heated region;

means for forming a second heated region from which said magnetic field is substantially absent; and transport means for transporting the continuous strip along a path through said first and second regions.

24. An apparatus according to claim 23, wherein said means for forming a first heated region is a first oven and said means for forming a second heated region is a second oven different from said first oven.

25. An apparatus according to claim 23, including a single oven which constitutes both of said means for forming a first heated region and said means for forming a second heated region.

26. A magnetostrictive element for use in a magnetomechanical electronic article surveillance marker, formed by first annealing an amorphous metal alloy in the presence of a saturating magnetic field and then second annealing the amorphous metal alloy in the absence of the saturating magnetic field.

27. A magnetostrictive element according to claim 26, wherein said second annealing is performed at a temperature of less than about 420° centigrade.

28. A magnetostrictive element according to claim 26, wherein said second annealing is performed within a period of not more than 150 seconds.

29. A magnetostrictive element for use in a magnetomechanical electronic article surveillance marker, formed by first annealing a continuous strip of an amorphous metal alloy in the presence of a saturating magnetic field, then second annealing the continuous strip in the absence of the saturating magnetic field, and then cutting the twice-annealed continuous strip into discrete strips.

30. A magnetostrictive element according to claim 29, wherein said second annealing is performed at a temperature of less than about 420° centigrade.

31. A magnetostrictive element according to claim 29, wherein said second annealing is performed within a period of not more than 150 seconds.

32. A marker for use in a magnetomechanical electric article surveillance system, comprising a discrete amorphous magnetostrictive strip formed by first annealing an amorphous metal alloy in the presence of a saturating magnetic field and then second annealing the amorphous metal alloy in the absence of the saturating magnetic field.

33. A marker according to claim 32, wherein said second annealing is performed at a temperature of less than about 420° centigrade.

34. A marker according to claim 32, wherein said second annealing is performed within a period of not more than 150 seconds.

35. A marker for use in a magnetomechanical electronic article surveillance system, comprising a discrete amorphous magnetostrictive strip formed by first annealing a continuous strip of an amorphous metal alloy in the presence of a saturating magnetic field, then second annealing the continuous strip in the absence of the saturating magnetic field, and then cutting the twice-annealed continuous strip into discrete strips.

36. A marker according to claim 35, wherein said second annealing is performed at a temperature of less than about 420° centigrade.

37. A marker according to claim 35, wherein said second annealing is performed within a period of not more than 150 seconds.

38. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element formed by first annealing an amorphous metal alloy in the presence of a saturating magnetic field and then second annealing the amorphous metal alloy in the absence of the saturating magnetic field, said marker also including a biasing element located adjacent to said magnetostrictive element, said biasing element being magnetically biased to cause said magnetostrictive element to be mechanically resonant when exposed to said alternating field; and (c) detecting means for detecting said mechanical resonance of said magnetostrictive element.

39. A magnetomechanical electronic article surveillance system according to claim 38, wherein said second annealing is performed at a temperature of less than about 420° centigrade.

40. A magnetomechanical electronic article surveillance system according to claim 38, wherein said second annealing is performed within a period of not more than 150 seconds.

41. A magnetomechanical electronic article surveillance system comprising:

(a) generating means for generating an electromagnetic field alternating at a selected frequency in an interrogation zone, said generating means including an interrogation coil;

(b) a marker secured to an article appointed for passage through said interrogation zone, said marker including an amorphous magnetostrictive element formed by first annealing a continuous strip of an amorphous metal alloy in the present of a saturating magnetic field, then second annealing the continuous strip in the absence of the saturating magnetic field, and then cutting the twice-annealed continuous strip into discrete strips, said marker also including a biasing element located adjacent to said magnetostrictive element, said biasing element being magnetically biased to cause said magnetostrictive element to be mechanically resonant when exposed to said alternating field; and (c) detecting means for detecting said mechanical resonance of said magnetostrictive element.

42. A magnetomechanical electronic article surveillance system according to claim 41, wherein said second annealing is performed at a temperature of less than about 420° centigrade.

43. A magnetomechanical electronic article surveillance system according to claim 41, wherein said second annealing is performed within a period of not more than 150 seconds.

44. A marker for use in a magnetomechanical electronic article surveillance system, comprising:

(a) an amorphous magnetostrictive element;

(b) a biasing element located adjacent said magnetostrictive element; and (c) said magnetostrictive element having
  (i) a hysteresis loop characteristic such that said magnetostrictive element does not produce substantial detectable harmonic frequencies when in an alternating electromagnetic field, and
  (ii) a resonant-frequency-to-bias-field slope characteristic of less than about 700 Hz/Oe in a bias field range of 5 Oe to 7 Oe.

45. A marker according to claim 44, wherein said resonant-frequency-to-bias-field slope characteristic of said magnetostrictive element is less than 500 Hz/Oe in said bias field range of 5 Oe to 7 Oe.

46. A marker for use in a magnetomechanical electronic article surveillance system, including a magnetostrictive element having a resonant-frequency-to-bias-field slope characteristic of less than about 700 Hz/Oe in a bias field range to 5 Oe to 7 Oe, said marker having an overall thickness of less than 0.065 inches.

47. A marker according to claim 46, wherein said resonant-frequency-to-bias-field slope characteristic of said magnetostrictive element is less than 500 Hz/Oe in said bias field range of 5 Oe to 7 Oe.

48. A marker according to claim 46, wherein the overall thickness of said marker is less than 0.030 inches.

49. A marker according to claim 46, wherein the overall thickness of said marker is about 0.005 inches.

* * * * *

UNITED STATES PATENT AND TRADEMARK OFFICE
CERTIFICATE OF CORRECTION

PATENT NO. : 5,568,125
DATED : October 22, 1996
INVENTOR(S) : Liu, Nen-Chin

It is certified that error appears in the above-identified patent and that said Letters Patent is hereby corrected as shown below:

Col. 8, line 17, delete "ascast" and insert -- as-cast --.

Signed and Sealed this

Ninth Day of June, 1998

Attest:

BRUCE LEHMAN

Attesting Officer     *Commissioner of Patents and Trademarks*